United States Patent
Swaminathan et al.

(10) Patent No.: US 8,609,532 B2
(45) Date of Patent: Dec. 17, 2013

(54) MAGNETICALLY SINTERED CONDUCTIVE VIA

(75) Inventors: Rajasekaran Swaminathan, Chandler, AZ (US); Ravindranath V. Mahajan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 486 days.

(21) Appl. No.: 12/787,968

(22) Filed: May 26, 2010

(65) Prior Publication Data

US 2011/0291276 A1    Dec. 1, 2011

(51) Int. Cl.
*H01L 21/4763*    (2006.01)

(52) U.S. Cl.
USPC .................. 438/629; 438/622; 438/672

(58) Field of Classification Search
USPC .................................. 438/622, 629, 672
See application file for complete search history.

(56) References Cited

U.S. PATENT DOCUMENTS

| | | |
|---|---|---|
| 3,839,727 A | 10/1974 | Herdzik et al. |
| 4,983,804 A | 1/1991 | Chan et al. |
| 5,048,744 A | 9/1991 | Chang et al. |
| 5,093,545 A | 3/1992 | McGaffigan |
| 5,346,775 A | 9/1994 | Jin et al. |
| 5,353,498 A | 10/1994 | Fillion et al. |
| 5,497,033 A | 3/1996 | Fillion et al. |
| 5,509,815 A * | 4/1996 | Jin et al. ................... 439/91 |
| 5,516,030 A | 5/1996 | Denton |
| 5,527,741 A | 6/1996 | Cole et al. |
| 5,838,069 A | 11/1998 | Itai et al. |
| 5,841,193 A | 11/1998 | Eichelberger |
| 5,846,366 A | 12/1998 | Jin et al. |
| 5,907,786 A | 5/1999 | Shinomiya |
| 5,953,629 A * | 9/1999 | Imazeki et al. .............. 438/679 |
| 6,154,366 A | 11/2000 | Ma et al. |
| 6,159,767 A | 12/2000 | Eichelberger |
| 6,174,797 B1 | 1/2001 | Bao et al. |
| 6,239,482 B1 | 5/2001 | Fillion et al. |
| 6,242,282 B1 | 6/2001 | Fillion et al. |
| 6,271,469 B1 | 8/2001 | Ma et al. |
| 6,306,680 B1 | 10/2001 | Fillion et al. |
| 6,396,148 B1 | 5/2002 | Eichelberger et al. |
| 6,396,153 B2 | 5/2002 | Fillion et al. |
| 6,423,570 B1 | 7/2002 | Ma et al. |
| 6,426,545 B1 | 7/2002 | Eichelberger et al. |
| 6,454,159 B1 | 9/2002 | Takushima |
| 6,459,150 B1 * | 10/2002 | Wu et al. ................... 257/724 |
| 6,489,185 B1 | 12/2002 | Towle et al. |
| 6,555,906 B2 | 4/2003 | Towle et al. |
| 6,555,908 B1 | 4/2003 | Eichelberger et al. |
| 6,580,611 B1 | 6/2003 | Vandentop et al. |
| 6,586,276 B2 | 7/2003 | Towle et al. |
| 6,586,822 B1 | 7/2003 | Vu et al. |
| 6,586,836 B1 | 7/2003 | Ma et al. |

(Continued)

OTHER PUBLICATIONS

Habib, et al., "Novel Solder-Magnetic Particle Composites and Their Reflow Using AC Magnetic Fields", IEEE Transactions on Magnetics, vol. 46, No. 6, Jun. 2010, pp. 1-4.

(Continued)

*Primary Examiner* — James Mitchell
(74) *Attorney, Agent, or Firm* — Winkle, PLLC

(57) ABSTRACT

The present disclosure relates to the field of fabricating microelectronic packages, wherein microelectronic components of the microelectronic packages may have sintered conductive vias comprising sintered metal and magnetic particles.

21 Claims, 7 Drawing Sheets

(56) References Cited

U.S. PATENT DOCUMENTS

| | | | |
|---|---|---|---|
| 6,617,682 B1 | 9/2003 | Ma et al. | |
| 6,642,485 B2 | 11/2003 | Goenka et al. | |
| 6,703,400 B2 | 3/2004 | Johnson et al. | |
| 6,706,553 B2 | 3/2004 | Towle et al. | |
| 6,709,898 B1 | 3/2004 | Ma et al. | |
| 6,713,859 B1 | 3/2004 | Ma | |
| 6,730,533 B2 * | 5/2004 | Durocher et al. | 438/26 |
| 6,734,534 B1 | 5/2004 | Vu et al. | |
| 6,794,223 B2 | 9/2004 | Ma et al. | |
| 6,818,544 B2 | 11/2004 | Eichelberger et al. | |
| 6,825,063 B2 | 11/2004 | Vu et al. | |
| 6,841,413 B2 | 1/2005 | Liu et al. | |
| 6,888,240 B2 | 5/2005 | Towle et al. | |
| 6,894,399 B2 | 5/2005 | Vu et al. | |
| 6,902,950 B2 | 6/2005 | Ma et al. | |
| 6,964,889 B2 | 11/2005 | Ma et al. | |
| 7,067,356 B2 | 6/2006 | Towle et al. | |
| 7,071,024 B2 | 7/2006 | Towle et al. | |
| 7,078,788 B2 | 7/2006 | Vu et al. | |
| 7,109,055 B2 | 9/2006 | McDonald et al. | |
| 7,112,467 B2 | 9/2006 | Eichelberger et al. | |
| 7,160,755 B2 | 1/2007 | Lo et al. | |
| 7,183,658 B2 | 2/2007 | Towle et al. | |
| 7,189,596 B1 | 3/2007 | Mu et al. | |
| 7,213,329 B2 | 5/2007 | Kim et al. | |
| 7,416,918 B2 | 8/2008 | Ma | |
| 7,420,273 B2 | 9/2008 | Liu et al. | |
| 7,425,464 B2 | 9/2008 | Fay et al. | |
| 7,442,581 B2 | 10/2008 | Lytle et al. | |
| 7,476,563 B2 | 1/2009 | Mangrum et al. | |
| 7,588,951 B2 | 9/2009 | Mangrum et al. | |
| 7,595,226 B2 | 9/2009 | Lytle et al. | |
| 7,619,901 B2 | 11/2009 | Eichelberger et al. | |
| 7,632,715 B2 | 12/2009 | Hess et al. | |
| 7,648,858 B2 | 1/2010 | Tang et al. | |
| 7,651,889 B2 | 1/2010 | Tang et al. | |
| 7,655,502 B2 | 2/2010 | Mangrum et al. | |
| 7,659,143 B2 | 2/2010 | Tang et al. | |
| 7,829,975 B2 * | 11/2010 | Hayasaka et al. | 257/621 |
| 7,902,060 B2 | 3/2011 | Swaminathan | |
| 8,183,677 B2 * | 5/2012 | Meyer-Berg | 257/686 |
| 8,188,581 B2 | 5/2012 | Shi et al. | |
| 2002/0185309 A1 | 12/2002 | Imamura et al. | |
| 2004/0013860 A1 * | 1/2004 | Sumi et al. | 428/209 |
| 2007/0231961 A1 | 10/2007 | Teshirogi et al. | |
| 2008/0048009 A1 | 2/2008 | Maeda et al. | |
| 2008/0054448 A1 | 3/2008 | Lu et al. | |
| 2008/0165518 A1 | 7/2008 | Ichiryu et al. | |
| 2008/0283387 A1 | 11/2008 | Rice et al. | |
| 2008/0315377 A1 | 12/2008 | Eichelberger et al. | |
| 2008/0315391 A1 | 12/2008 | Kohl et al. | |
| 2009/0027857 A1 | 1/2009 | Dean et al. | |
| 2009/0072012 A1 | 3/2009 | Sakaguchi et al. | |
| 2009/0072382 A1 | 3/2009 | Guzek | |
| 2009/0079063 A1 | 3/2009 | Chrysler et al. | |
| 2009/0079064 A1 | 3/2009 | Tang et al. | |
| 2009/0166396 A1 | 7/2009 | Supriya et al. | |
| 2009/0212416 A1 | 8/2009 | Skeete | |
| 2009/0294942 A1 | 12/2009 | Palmer et al. | |
| 2009/0301769 A1 * | 12/2009 | Seppa et al. | 174/257 |
| 2010/0044855 A1 | 2/2010 | Eichelberger et al. | |
| 2010/0047970 A1 | 2/2010 | Eichelberger et al. | |
| 2010/0105171 A1 * | 4/2010 | Lee et al. | 438/113 |
| 2010/0159692 A1 | 6/2010 | Swaminathan | |
| 2010/0282823 A1 | 11/2010 | Ulicny et al. | |
| 2011/0101491 A1 | 5/2011 | Skeete et al. | |
| 2011/0108999 A1 | 5/2011 | Nalla et al. | |
| 2011/0156231 A1 | 6/2011 | Guzek | |
| 2011/0210283 A1 * | 9/2011 | Ramirez et al. | 252/62.55 |
| 2011/0215464 A1 | 9/2011 | Guzek et al. | |
| 2011/0228464 A1 | 9/2011 | Guzek et al. | |
| 2011/0241186 A1 | 10/2011 | Nalla et al. | |
| 2011/0241195 A1 | 10/2011 | Nalla et al. | |
| 2011/0241215 A1 | 10/2011 | Sankman et al. | |
| 2011/0254124 A1 | 10/2011 | Nalla et al. | |
| 2011/0266030 A1 * | 11/2011 | Swaminathan et al. | 174/126.2 |
| 2011/0278044 A1 | 11/2011 | Aleksov et al. | |
| 2011/0278351 A1 | 11/2011 | Aleksov et al. | |
| 2011/0281375 A1 | 11/2011 | Swaminathan et al. | |
| 2012/0001339 A1 | 1/2012 | Malatkar | |
| 2012/0009738 A1 | 1/2012 | Crawford et al. | |
| 2012/0049382 A1 | 3/2012 | Malatkar | |

OTHER PUBLICATIONS

"Yale Scientists Develop Magnetic Lead-free Solder", SMT Magazine Archive, Mar. 8, 2010, Retrieved on Dec. 6, 2010, Document Available at: <http://www.ems007.com/pages/zone.cgi?a=60208&artpg=1>, 2 pages.

Calabro, Joshua D., et al. "Magnetically Driven Three-Dimensional Manipulation and Inductive Heating of Magnetic-Dispersion Containing Metal Alloys", Department of Mechanical Engineering, Yale University, New Haven, CT 06520; and Department of Materials Science and Engineering, Massachusetts Institute of Technology, Cambridge, PNAS, Mar. 16, 2010, vol. 107 No. 11 pp. 4834-4839.

MMcCormack, M. et al., "Enhanced Solder Alloy Performance by Magnetic Dispersions", IEEE Transactions on Components, Packaging, and Manufacturing Technology—Part A, vol. 17, No. 3, Sep. 1994, pp. 452-457.

Suwanwatana, W. et al., "Influence of particle size on hysteresis heating behavior of nickel particulate polymer films", Elsevier, Composites Science and Technology 66, May 30, 2006, pp. 2825-2836.

U.S. Appl. No. 12/778,335, filed May 12, 2010, 43 pages.
U.S. Appl. No. 12/778,313, filed May 12, 2010, 33 pages.
U.S. Appl. No. 12/777,476, filed May 11, 2010, 41 pages.
U.S. Appl. No. 12/768,842, filed Apr. 28, 2010, 33 pages.
Ma et al. U.S. Appl. No. 09/640,961, "Direct Build-Up Layer on an Encapsulated Die Package", Mailed on Aug. 16, 2000, 70 pages.

* cited by examiner

MAGNETICALLY SINTERED CONDUCTIVE VIA

BACKGROUND

A typical microelectronic package includes at least one microelectronic die that is mounted on a substrate such that bond pads on the microelectronic die are attached to corresponding bond lands on the substrate. Both the microelectronic die and the substrate may have numerous conductive routes, which may be formed on and between dielectric layers therein.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
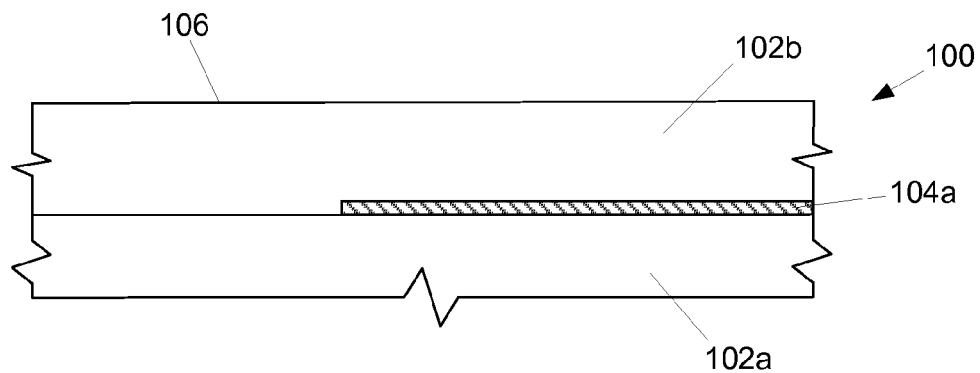
FIGS. 1-9 illustrate side cross-sectional views of a process of forming a magnetically sintered conductive via.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Embodiments of the present description relate to the field of fabricating microelectronic packages, wherein microelectronic components of the microelectronic packages may have sintered conductive vias comprising sintered metal and magnetic particles.

In the production of microelectronic packages, microelectronic dice are generally mounted on substrates, which provide electrical communication routes between the microelectronic dice and external components. A microelectronic die may be attached to a substrate, such as an interposer, a motherboard, and the like, through a plurality of interconnects, such as reflowable solder bumps or balls, in a configuration generally known as a flip-chip or controlled collapse chip connection ("C4") configuration.

A microelectronic die generally includes an interconnect layer having a plurality of dielectric layers having conductive traces formed thereon and therethrough. The interconnect layer forms conductive routes from integrated circuits formed in and on the microelectronic substrate to at least one conductive land. Interconnects are formed between the microelectronic die conductive lands and conductive land on other microelectronic components. Microelectronic components may be any microelectronic device, including, but not limited to, microelectronic dice, interposers, substrates, resistors, capacitors, inductors, power supplies, surge protection devices, and the like.

An interposer or substrate is essentially an interconnect device having interconnect layers forming conductive routes therethrough and/or therein to proper route electrical signal between microelectronic components.

FIG. 1 illustrates at least a portion of an interconnect layer 100 comprising a first dielectric layer 102a with a first conductive trace 104a formed on the first dielectric layer 102a, and a second dielectric layer 102b formed on the first dielectric layer 102a and the first conductive trace 104a. In one embodiment, where the interconnect layer 100 is formed on a front side 212 of a microelectronic die 200 (see FIG. 11), such as a microprocessor, a chipset, a graphics device, a wireless device, a memory device, an application specific integrated circuit, or the like, the dielectric layers (such as first dielectric layer 102a and second dielectric layer 102b) of the interconnect layer 100 may be any appropriate dielectric material, including but not limited to a silicon oxide, silicon nitride, and low-K dielectric materials (i.e. dielectric materials with a dielectric constant "K" lower than that of silicon oxide), including but not limited to carbon doped silicon dioxide and fluorine doped silicon dioxide. In another embodiment, where the interconnect layer is part of a substrate, such as an interposer 400 or a motherboard 300 (see FIG. 11), the dielectric layers (such as first dielectric layer 102a and second dielectric layer 102b) of the interconnect layer 100 may be any appropriate material, including but not limited to, bismaleimine triazine resin, fire retardant grade 4 material, polyimide materials, glass reinforced epoxy matrix material, and the like, as well as laminates or multiple layers thereof. The first conductive trace 104a may be any appropriate electrically conductive material, including but not limited to copper, aluminum, silver, gold, or alloys thereof.

Figure 2:
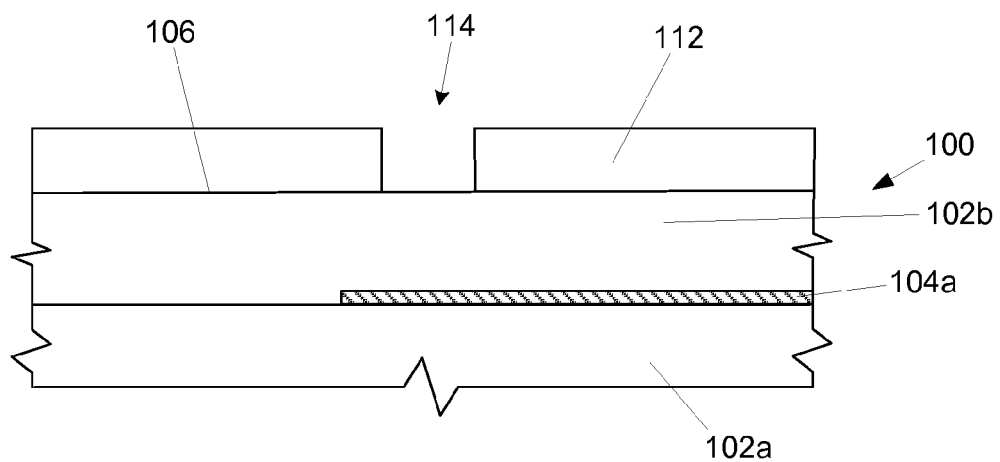
Figure 3:
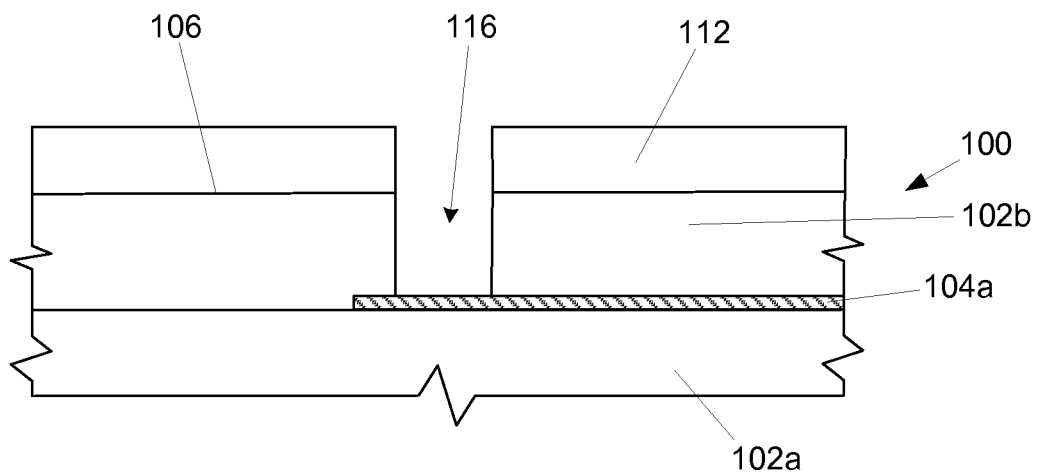

As shown in FIG. 2, an outer surface 106 of the second dielectric layer 102b may have a mask 112 patterned thereon. The mask 112 may have an opening 114 extending therethrough to expose a portion of the second dielectric layer 102b. The second dielectric layer 102b may be etched by any technique known in the art to expose a portion of the first conductive trace 104a thereby forming a via 116, as shown in FIG. 3. After etching, the mask 112 may be removed, shown in FIG. 4. In one embodiment, the mask 112 may be a photoresist material, which may be patterned by lithographic techniques known in the art. It is understood that the via 116 could be formed by other processes known in the art, including but not limited to laser or ion drilling.

Figure 4:
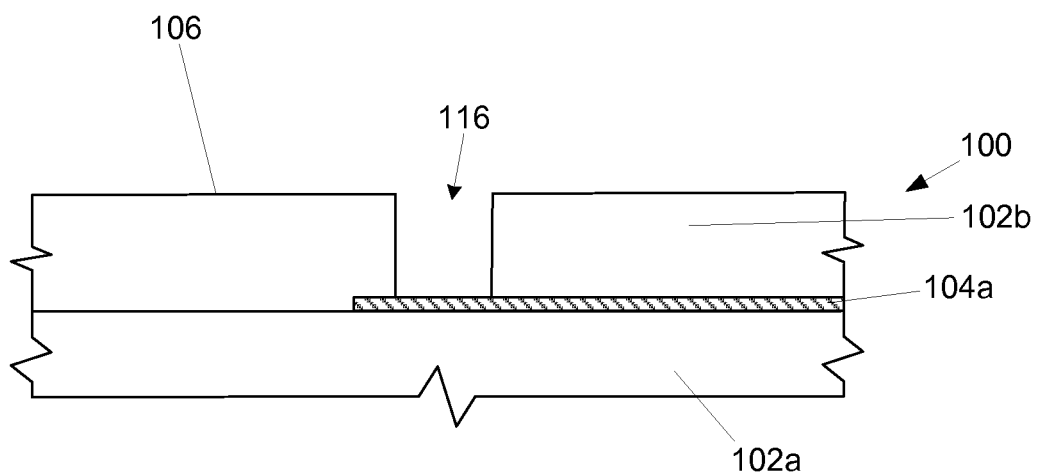
Figure 5:
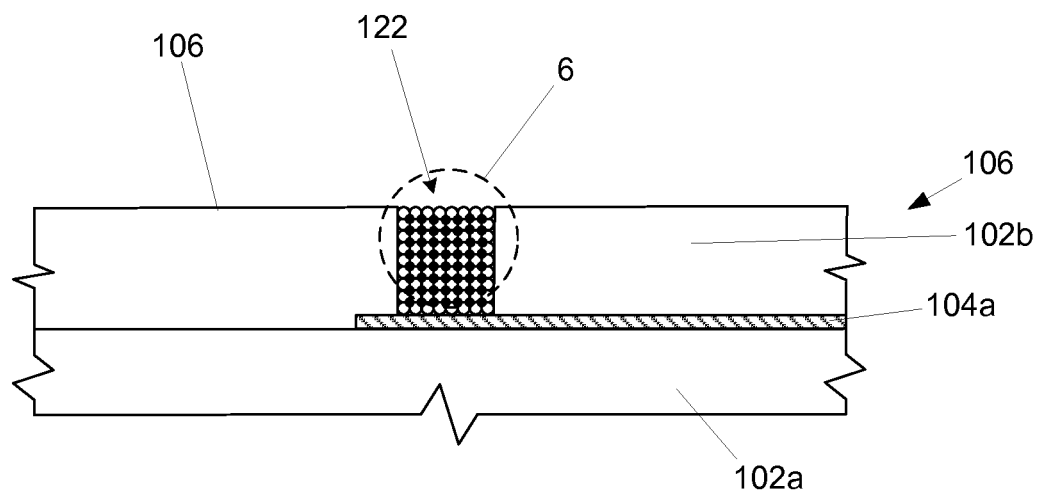
Figure 6:
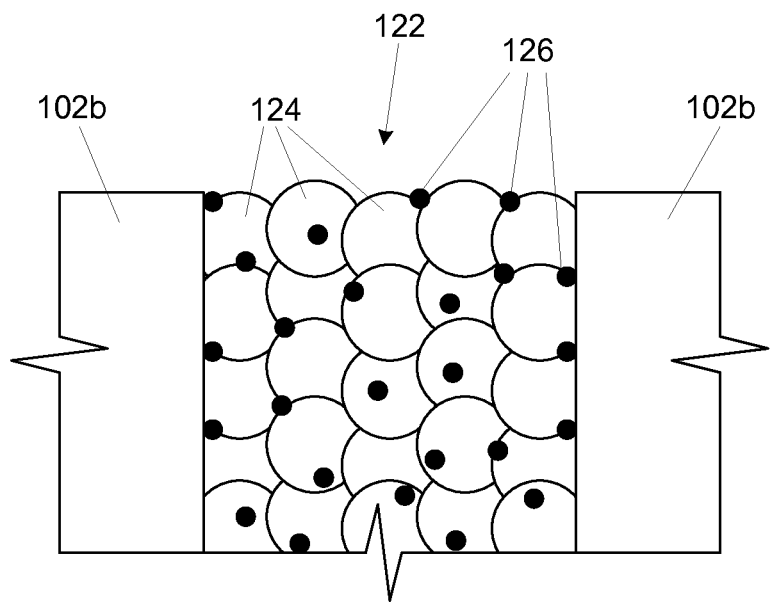

As shown in FIGS. 5 and 6, a composite powder material 122 may be deposited to substantially fill the via 116 (see FIG. 4). The composite powder material 122 comprises metal particles 124 and magnetic particles 126 (see FIG. 6, which is a close-up of inset 6 of FIG. 5). The metal particles 124 may be any appropriate conductive metal material. In one embodiment the metal particles 124 comprise particles of solder, including but not limited to lead/tin alloys, such as tin/lead solder, such as 63% tin/37% lead solder, or lead-free solders, such a pure tin or high tin content alloys (e.g. 90% or more tin), such as tin/bismuth, eutectic tin/silver, ternary tin/silver/copper, eutectic tin/copper, and similar alloys, and pure indium and indium based alloys, such as indium/silver and indium/tin. In other embodiment, the metal particles 124 may comprise particles of copper, aluminum, silver, gold, or alloys thereof.

The composite powder material 122 may be deposited by any known technique, including but not limited to stencil printing (where the composite powder material 122 is in a paste form), spraying (such as with inkjet technologies), and dispensing with a nozzle. These techniques would require that the composite powder material 122 have some fluidity which can be provided by the powder itself, or with the addition of a fluid that volatilizes after deposition. Further techniques may include electrophoretic infiltration, pressure infiltration, and injection molding, each of which use a lithographically patterned stencil and the application of pressure. A modified plating process may also be used where the metal particles 124 and the magnetic particles 126 are combined in a plating solution and selectively deposited in the via 116.

The magnetic particles 126 may include, but are not limited to, iron (Fe), cobalt (Co), nickel (Ni), and their respective alloys. Examples may also include ferrites and oxides containing magnetic metals. In one embodiment, the magnetic particles 126 may be $MFe_2O_4$, where M may be any metal and O is oxygen. In another embodiment, the magnetic particles may be $BaFe_{12}O_{17}$, where Ba is barium. In yet another embodiment, the magnetic particles 126 may comprise an iron/cobalt alloy. In certain embodiments, the magnetic particles 126 may include a coating such as a conformal tin (Sn)/tin-based alloy/copper (Cu) layer formed, for example, by a deposition procedure, such as sputtering.

In one embodiment, the composite powder material 122 may contain between about 1% and 99% by weight of metal particles 124. In a more specific embodiment, the composite powder material 122 may contain between about 90% and 99% by weight of metal particles 124. In another embodiment, the composite powder material 122 may have the metal particles 124 sized to be less the half the size of the via 116 to be filled, which would scale with the size of the via 116.

In still another embodiment, the composite powder material 122 may contain between about 1% and 99% by weight of magnetic particles 126. In a more specific embodiment, the composite powder material 122 may contain between about 1% and 10% by weight of magnetic particles 126. In still another embodiment, the composite powder material 122 may have the magnetic particles 126 sized between about 5 nm and 100 nm in length.

Figure 7:
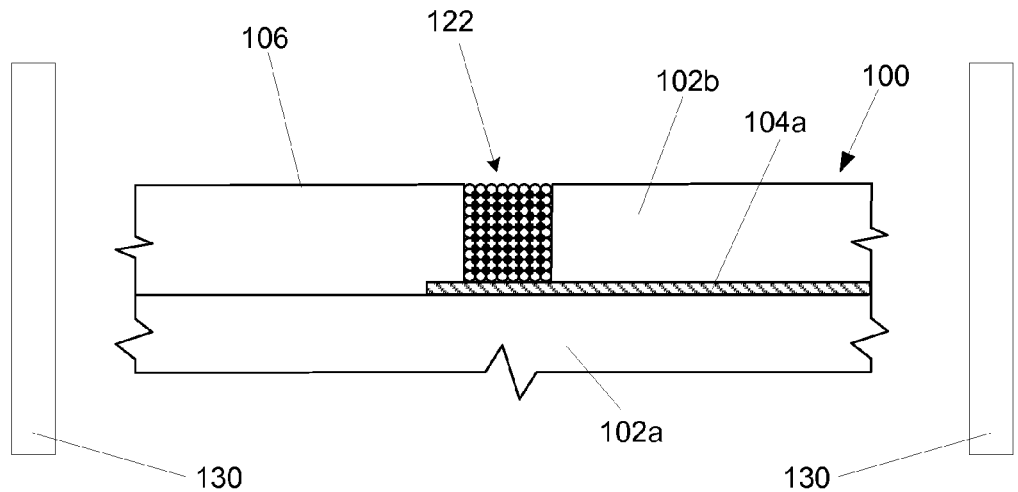
Figure 8:
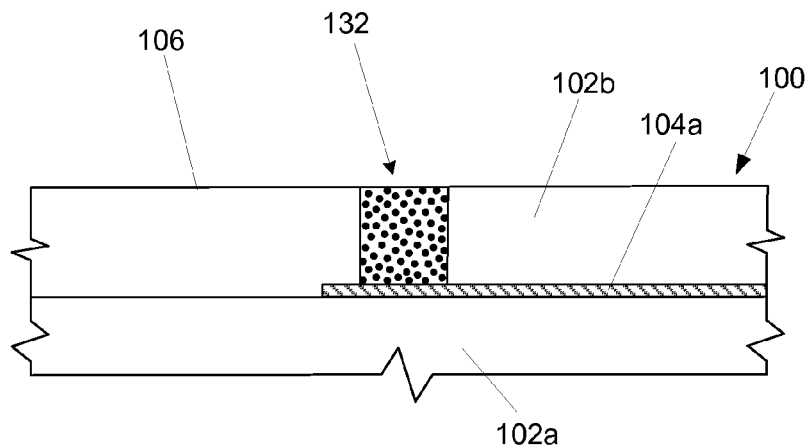

A magnetic field generator 130, as shown in FIG. 7, may be placed proximate the composite powder material 122. In the presence of alternating current magnetic fields generated by the magnetic field generator 130, the magnetic particles 126 within the composite powder material 122 will generate heat by relaxational and hysteretic loss modes. Relaxational losses occur in single domain magnetic particles and they release heat when the magnetic moment of the particle rotates with the applied magnetic field (Neel motion) and when the particle itself rotates due to Brownian motion. Hystereis losses occur in multi-domain particles, and generate heat due to the various magnetic moments (due to multi-domains) rotating against the applied magnetic field. These losses occur with every cycle in the alternating current field, and the net heat generated increases with increasing number of field cycles. The various factors controlling heating rates may include, but are not necessarily limited to, magnetic particle size and size distribution, magnetic particle volume fractions (heat generation scales substantially linearly with volume fraction), magnetic material choice (oxides, metallic (pure and alloy), and layered magnetic particles (as previously discussed)), shape anisotropy of the magnetic particles, and the applied frequency and amplitude of the alternating current used in the magnetic field generator 130. Therefore, when an alternating current magnetic field is applied by the magnetic field generator 130, the magnetic particles 126 within the composite powder material 122 essentially vibrate and heat up to sinter the composite powder material 122 into a magnetically sintered conductive via 132, as shown in FIG. 8. Sintering is a method for making objects from powder, by heating the material, usually below its melting point (known as solid state sintering), until the particles adhere to each other.

The resulting magnetically sintered conductive via 132 may be substantially free of voids. In known sintering techniques, voids may form within the sintered material from the particles having substantially the same size and due to the fact that the particles are unable to fill these voids during subsequent high temperature processes, which may be performed. When used for microelectronic components, voids in sintered vias in microelectronic dice and substrates may cause reliability failures, such as via delamination and electromigration issues, as will be understood to those skilled in the art. Some voiding may be decreased by using particles of differing particle size ranges; however, voiding problems may still not be completely eliminated.

The localized heating of the composite powder material 122, as set forth in the present description, may enable precisely controlled sintering, thereby reducing or substantially eliminating voids in the resulting magnetically sintered conductive via 132. The localized heat generated by the magnetic particles 126 is sufficient to actually melt metal particles 124 locally by induction heating mechanisms, rather than eddy current based, thereby resulting in even very small voids being filled. Even a small fraction of magnetic particles 126, such as between about 1% and 3% can be used to generate enough heat to enable sintering. Of course, with the reduction or substantial elimination of voids within the magnetically sintered conductive via 132, reliability failures may be reduced.

Figure 9:
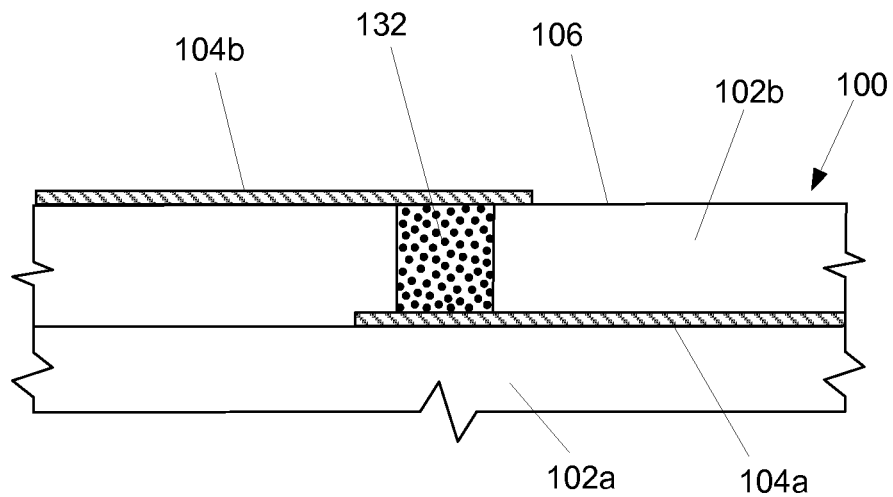

As shown in FIG. 9, a second conductive trace 104b may be formed on the second dielectric layer 102b by any known method. It is, of course, understood that multiple dielectric layers, multiple conductive traces, and multiple magnetically sintered conductive vias may be configured and stacked to form the interconnect layer 100. The second conductive trace 104b may be any appropriate electrically conductive material, including but not limited to copper, aluminum, silver, gold, or alloys thereof.

Figure 10:
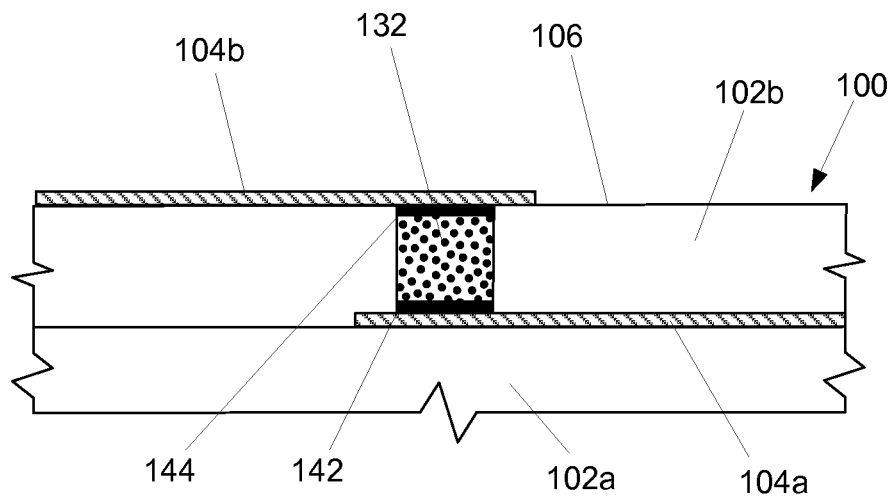
FIG. 10 illustrates a side cross-sectional view of another embodiment of a magnetically sintered conductive via.

In another embodiment, the magnetic particles 126 may be formed as a first magnetic particle layer 142 abutting the first conductive trace 104a and as a second magnetic particle layer 144 abutting a second conductive trace 104b, as shown in FIG. 10. The first magnetic particle layer 142 and the second particle layer 144 may provide local heating gradients to control formation of surface intermetallics and create favorable gradients used to generate enough heat to enable sintering, as will be understood to those skilled in the art.

It is understood that the described embodiments could be employed in a bumpless build-up layer (BBUL) interconnect, as will be understood to those skilled in the art.

Although the described embodiments within this description are directed to specific substrates and microelectronic devices, it is understood that the concepts apply equally to any appropriate microelectronic packaging or attachment process, including but not limited to First Level Interconnects (FLI) where microelectronic dice are attached to substrates or interposers, to Second Level Interconnects (SLI) where substrates or interposers are attached to a board or a motherboard, to Direct Chip Attach (DCA) where microelectronic dice are attached directly to a board or a motherboard, and to the attachment of microelectronic dice attached to one another through-silicon vias (TSV).

Figure 11:
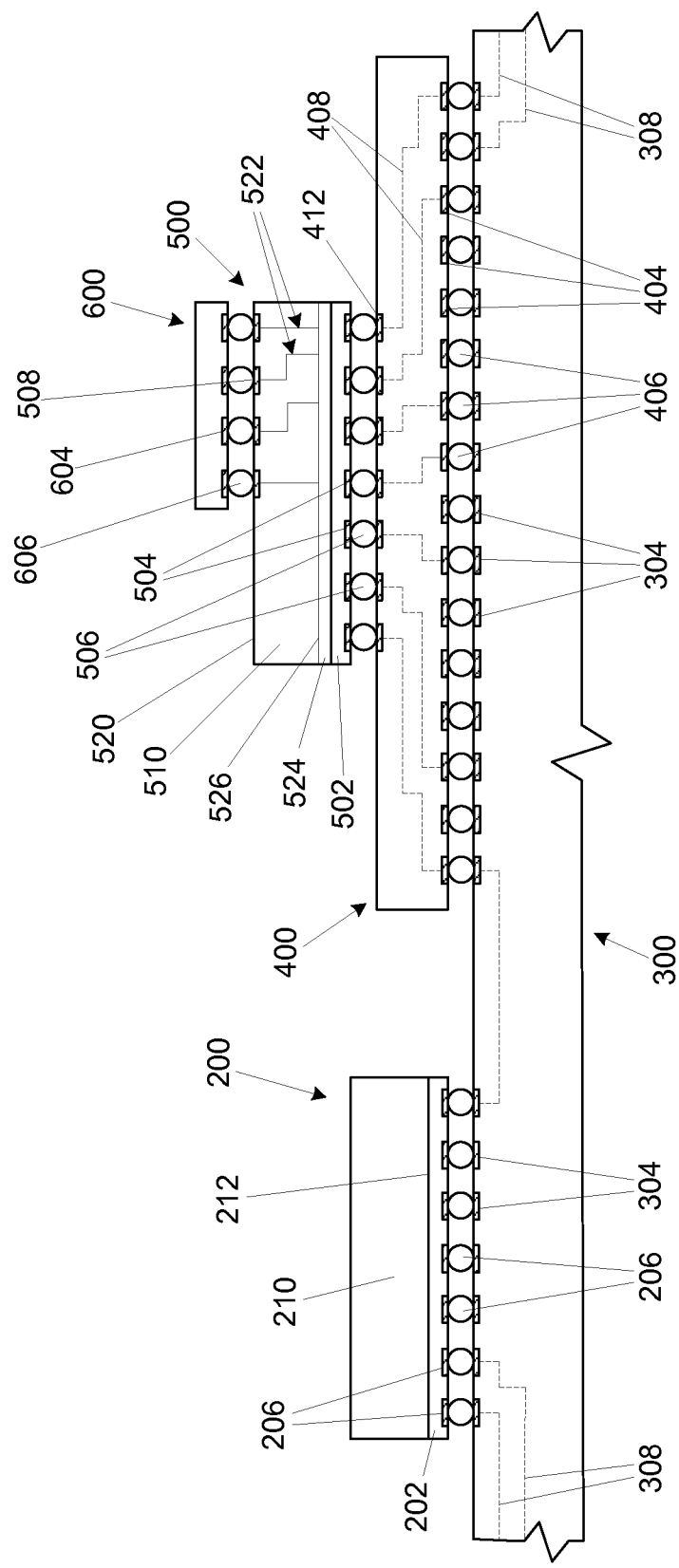
FIG. 11 illustrates a side cross-sectional view of a microelectronic package illustrating different potential positions for the magnetically sintered conductive vias within the microelectronic package.

FIG. 11 illustrates various attachment structures utilizing the embodiments of the present disclosure. A microelectronic die 200 may be in a Direct Chip Attach (DCA) attachment to a substrate 300, such as a motherboard. The microelectronic die 200 may comprise a microelectronic substrate 210, such as an amorphous silicon or a silicon-germanium wafer, having an interconnect layer 202 comprising magnetically sintered conductive vias, as previously discussed with regard to FIGS. 1-10, formed on a front side 212 thereof. The interconnect layer 202 may route electrical signals from integrated circuits formed in and on the microelectronic substrate 210 to contact lands 204, where interconnects 206, such as solder bumps, form an electrical attachment between the microelectronic die contact lands 204 and corresponding contact lands 304 on the substrate. The substrate 300 itself may be an interconnect structure, as previously discussed with regard to FIGS. 1-10, which electrically connects the microelectronic die 200 to external components (not shown). The conductive traces and the magnetically sintered conductive vias are represent simply as dashed lines 308, wherein the horizontal portion thereof would correspond to the conductive traces 104a, 104b (see FIGS. 9 and 10), and the vertical portions thereof would correspond to the magnetically sintered conductive vias 132 (see FIGS. 9 and 10).

An interposer 400 may also for attached in Second Level Interconnect (SLI) fashion to the substrate 300, through interconnect 406 extending between interposer first contact lands 404 and corresponding substrate contact lands 304. As with the substrate 300, the interposer 400 may also be, in and of itself, an interconnect structure, as previously discussed with regard to FIGS. 1-10. The conductive traces and the magnetically sintered conductive vias are represent simply as dashed lines 408, wherein the horizontal portion thereof would correspond to the conductive traces 104a, 104b (see FIGS. 9 and 10), and the vertical portions thereof would correspond to the magnetically sintered conductive vias 132 (see FIGS. 9 and 10). The conductive traces and the magnetically sintered conductive vias (i.e. dashed lines 408) extending between interposer second contact lands 412 and the interposer first contact lands 404.

Another microelectronic die 500, also comprising a microelectronic substrate 510 and an interconnect layer 502, may be attached to the interposer 400, wherein the interposer 400 routes the signals between the microelectronic die 500 and the substrate 300. The microelectronic die 500 may be attached to the interposer 400 through interconnects 506 extending between contact lands 504 on the interconnection layer 502 of the microelectronic die 500 and the interposer second contact lands 412. The microelectronic die interconnect layer 502 may be the same as described for interconnect layer 202.

A microelectronic device 600, such as a microelectronic die, may be attached to a back side 520 of the microelectronic die 500 with interconnects 606 extending between contact lands 604 and corresponding contact lands 508 on microelectronic die back side 520. The microelectronic die back side contact lands 508 may be in electrical communication, shown as dashed lines 522 with integrated circuits (not shown) formed in a zone 524 between the microelectronic die interconnect layer 502 and a depth demarked by dotted line 526. The electrical communication may be achieve with through-silicon vias that are also formed to include magnetically sintered conductive vias 132, as described in FIGS. 1-10. In the instance of through-silicon vias, the opening 116 (see FIG. 4) is formed in the microelectronic substrate 510. Other processing parameter of through-silicon vias will be understood to those skilled in the art.

It is also understood that the subject matter of the present description is not necessarily limited to specific applications illustrated in FIGS. 1-11. The subject matter may be applied to other application were a sintered connection in a microelectronic device or substrate. Furthermore, the subject matter may also be used in any appropriate application outside of the microelectronic device fabrication field.

Figure 12:
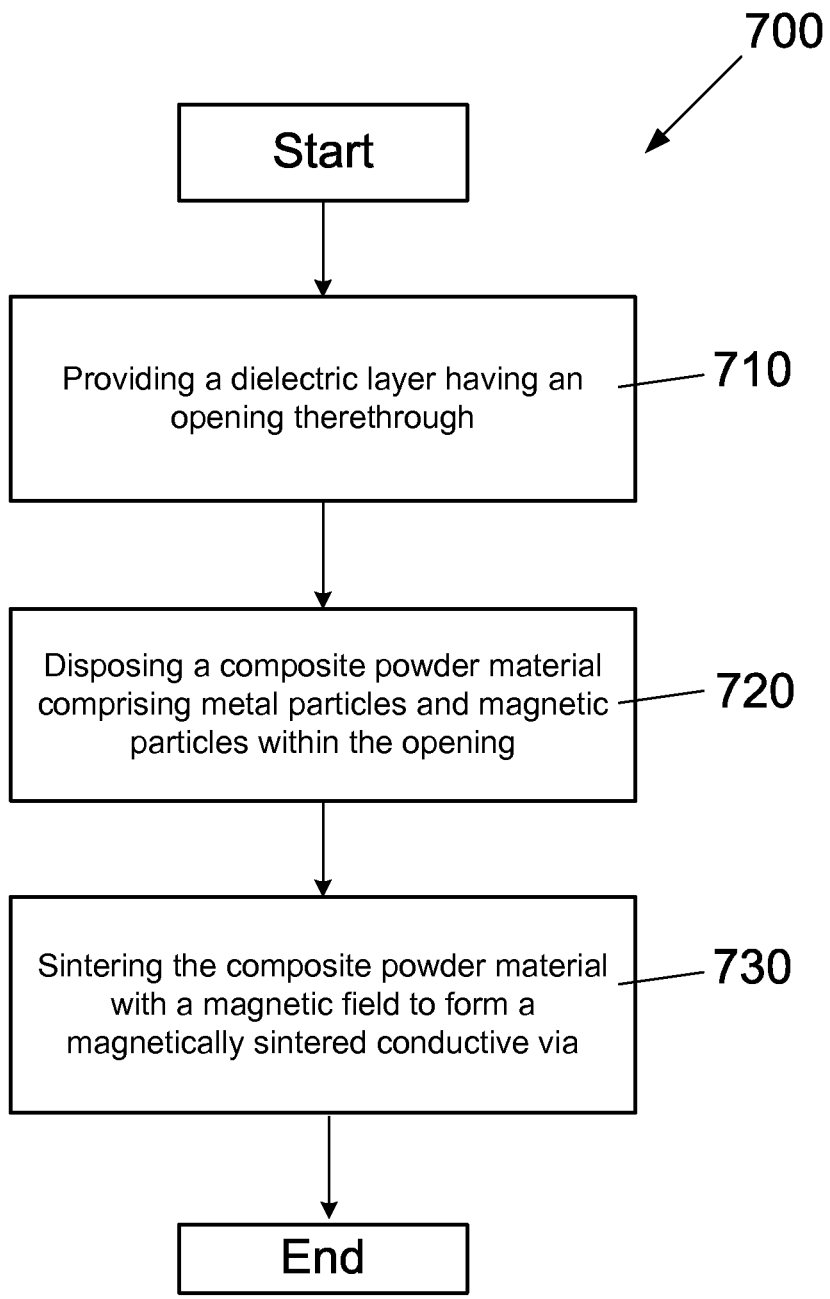
FIG. 12 is a flow diagram of a process of forming the magnetically sintered conductive via.

An embodiment of a process of the present description is illustrated in the flow diagram 700 of FIG. 12. As defined in block 710, a layer dielectric may be provided having at least one opening therethrough. A composite powder material comprising metal particles and magnetic particles may be disposed in the opening, as defined in block 720. As defined in block 730, the composite powder material is sintered by a magnetic field to form a magnetically sintered conductive via.

The detailed description has described various embodiments of the devices and/or processes through the use of illustrations, block diagrams, flowcharts, and/or examples. Insofar as such illustrations, block diagrams, flowcharts, and/or examples contain one or more functions and/or operations, it will be understood by those skilled in the art that each function and/or operation within each illustration, block diagram, flowchart, and/or example can be implemented, individually and/or collectively, by a wide range of hardware, software, firmware, or virtually any combination thereof.

The described subject matter sometimes illustrates different components contained within, or connected with, different other components. It is understood that such illustrations are merely exemplary, and that many alternate structures can be implemented to achieve the same functionality. In a conceptual sense, any arrangement of components to achieve the same functionality is effectively "associated" such that the desired functionality is achieved. Thus, any two components herein combined to achieve a particular functionality can be seen as "associated with" each other such that the desired functionality is achieved, irrespective of structures or intermediate components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

It will be understood by those skilled in the art that terms used herein, and especially in the appended claims are generally intended as "open" terms. In general, the terms "including" or "includes" should be interpreted as "including but not limited to" or "includes but is not limited to", respectively. Additionally, the term "having" should be interpreted as "having at least".

The use of plural and/or singular terms within the detailed description can be translated from the plural to the singular and/or from the singular to the plural as is appropriate to the context and/or the application.

It will be further understood by those skilled in the art that if an indication of the number of elements is used in a claim, the intent for the claim to be so limited will be explicitly recited in the claim, and in the absence of such recitation no such intent is present. Additionally, if a specific number of an introduced claim recitation is explicitly recited, those skilled in the art will recognize that such recitation should typically be interpreted to mean "at least" the recited number.

The use of the terms "an embodiment," "one embodiment," "some embodiments," "another embodiment," or "other embodiments" in the specification may mean that a particular feature, structure, or characteristic described in connection with one or more embodiments may be included in at least some embodiments, but not necessarily in all embodiments. The various uses of the terms "an embodiment," "one embodiment," "another embodiment," or "other embodiments" in the detailed description are not necessarily all referring to the same embodiments.

While certain exemplary techniques have been described and shown herein using various methods and systems, it should be understood by those skilled in the art that various other modifications may be made, and equivalents may be substituted, without departing from claimed subject matter or spirit thereof. Additionally, many modifications may be made to adapt a particular situation to the teachings of claimed subject matter without departing from the central concept described herein. Therefore, it is intended that claimed subject matter not be limited to the particular examples disclosed, but that such claimed subject matter also may include all implementations falling within the scope of the appended claims, and equivalents thereof.

What is claimed is:

1. An apparatus comprising:
   a first microelectronic dielectric layer;
   a first microelectronic conductive trace formed on the first microelectronic dielectric layer;
   a second microelectronic dielectric layer formed on the first microelectronic dielectric layer and the first microelectronic conductive trace;
   wherein at least one of the first microelectronic dielectric layer and the second microelectronic dielectric layer comprises a material selected from the group consisting of silicon oxide, silicon nitride and low-K dielectric materials;
   a second microelectronic conductive trace formed on the second microelectronic dielectric layer; and
   a conductive via comprising a sintered composition of metal particles and magnetic particles, wherein the conductive via extends through the second microelectronic dielectric layer and contacts the first microelectronic conductive trace and the second microelectronic conductive trace wherein the magnetic particles of the conductive via includes a first magnetic particle layer abutting the first microelectronic conductive trace and a second magnetic particle layer abutting the second microelectronic conductive trace.

2. The apparatus of claim 1, wherein the magnetic particle include particles of iron, cobalt, nickel, or alloys thereof.

3. The apparatus of claim 1, wherein the magnetic particles between about 1% and 10% by weight of the sintered composition.

4. The apparatus of claim 1, wherein the metal particles include particles of solder.

5. The apparatus of claim 1, wherein the metal particles include particles of copper, aluminum, silver, gold, or alloys thereof.

6. A method of forming a magnetically sintered conductive via, comprising:
   forming a first microelectronic dielectric layer;
   forming a first microelectronic conductive trace on the first microelectronic dielectric layer;
   forming a second microelectronic dielectric layer on the first microelectronic dielectric layer and the first microelectronic conductive trace;
   forming an opening through the second microelectronic dielectric to expose a portion of the first microelectronic conductive trace;
   disposing a composite powder material comprising metal particles and magnetic particles within the opening;
   sintering the composite powder material with a magnetic field to form a conductive via; and
   forming a second microelectronic conductive trace on the second microelectronic dielectric layer contacting the conductive via.

7. The method of claim 6, wherein sintering the composite powder comprises heating the composite powder material to a sinter temperature with an alternating current magnetic field imparted on the composite powder material.

8. The method of claim 6, wherein at least one of forming the first microelectronic dielectric layer and forming the second microelectronic dielectric layer comprises forming at least one of the first microelectronic dielectric layer and forming the second microelectronic dielectric layer from a material selected from the group consisting of silicon oxide, silicon nitride and low-K dielectric materials.

9. The method of claim 6, wherein at least one of forming the first microelectronic dielectric layer and forming the second microelectronic dielectric layer comprises forming at least one of the first microelectronic dielectric layer and forming the second microelectronic dielectric layer from a material selected from the group consisting of bismaleimine triazine resin, fire retardant grade 4 material, polyimide material, and glass reinforced epoxy matrix material.

10. The method of claim 6, wherein disposing the composite powder material comprises disposing a composite powder material comprising metal particles and magnetic particles including iron, cobalt, nickel, or alloys thereof, within the opening.

11. The method of claim 6, wherein disposing the composite powder material comprises disposing a composite powder material comprising solder particles and magnetic particles within the opening.

12. The method of claim 6, wherein disposing the composite powder material comprises disposing a composite powder material comprising metal particles and the magnetic particles, where the magnetic particles comprise between about 1% and 10% by weight of the composite powder material.

13. The method of claim 6, wherein disposing the composite powder material comprises disposing a composite powder material comprising particles of copper, aluminum, silver, gold, or alloys thereof, and magnetic particles within the opening.

14. The method of claim 6, wherein disposing the composite powder material within the opening comprises forming a first magnetic particle layer abutting the first microelectronic conductive trace and a second magnetic particle layer abutting the second microelectronic conductive trace.

15. An apparatus comprising:
a first microelectronic dielectric layer;
a first microelectronic conductive trace formed on the first microelectronic dielectric layer;
a second microelectronic dielectric layer formed on the first microelectronic dielectric layer and the first microelectronic conductive trace;
a second microelectronic conductive trace formed on the second microelectronic dielectric layer; and
a conductive via comprising a sintered composition of metal particles and magnetic particles, wherein the conductive via extends through the second microelectronic dielectric layer and contacts the first microelectronic conductive trace and the second microelectronic conductive trace, wherein the magnetic particles of the conductive via includes a first magnetic particle layer abutting the first microelectronic conductive trace and a second magnetic particle layer abutting the second microelectronic conductive trace.

16. The apparatus of claim 15, wherein at least one of the first microelectronic dielectric layer and the second microelectronic dielectric layer comprises a material selected from the group consisting of silicon oxide, silicon nitride and low-K dielectric materials.

17. The apparatus of claim 15, wherein at least one of the first microelectronic dielectric layer and the second microelectronic dielectric layer comprises a material selected from the group consisting of bismaleimine triazine resin, fire retardant grade 4 material, polyimide material, and glass reinforced epoxy matrix material.

18. The apparatus of claim 15, wherein the magnetic particle include particles of iron, cobalt, nickel, or alloys thereof.

19. The apparatus of claim 15, wherein the magnetic particles between about 1% and 10% by weight of the sintered composition.

20. The apparatus of claim 15, wherein the metal particles include particles of solder.

21. The apparatus of claim 15, wherein the metal particles include particles of copper, aluminum, silver, gold, or alloys thereof.

* * * * *